US009633872B2

(12) United States Patent
Chen et al.

(10) Patent No.: US 9,633,872 B2
(45) Date of Patent: Apr. 25, 2017

(54) INTEGRATED CIRCUIT PACKAGE WITH ACTIVE INTERPOSER

(71) Applicant: Altera Corporation, San Jose, CA (US)

(72) Inventors: Shuxian Chen, Fremont, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 842 days.

(21) Appl. No.: 13/752,808

(22) Filed: Jan. 29, 2013

(65) Prior Publication Data

US 2014/0210097 A1    Jul. 31, 2014

(51) Int. Cl.

| | | |
|---|---|---|
| *H01L 21/50* | (2006.01) | |
| *H01L 23/52* | (2006.01) | |
| *H01L 25/18* | (2006.01) | |
| H01L 23/528 | (2006.01) | |
| H01L 23/31 | (2006.01) | |
| H01L 23/498 | (2006.01) | |

(52) U.S. Cl.
CPC .............. *H01L 21/50* (2013.01); *H01L 25/18* (2013.01); *H01L 23/3128* (2013.01); *H01L 23/49816* (2013.01); *H01L 23/5286* (2013.01); *H01L 2224/16145* (2013.01); *H01L 2224/16225* (2013.01); *H01L 2224/17181* (2013.01); *H01L 2225/06513* (2013.01); *H01L 2225/06517* (2013.01); *H01L 2924/15311* (2013.01)

(58) Field of Classification Search
CPC ... H01L 21/50; H01L 23/5226; H01L 23/522; H01L 224/16225; H01L 2924/15311; H01L 2224/16145; H01L 2224/16225

USPC .......................................................... 361/790
See application file for complete search history.

(56) References Cited

U.S. PATENT DOCUMENTS

| | | |
|---|---|---|
| 5,955,870 A | 9/1999 | Nair |
| 7,051,306 B2 | 5/2006 | Hoberman et al. |
| 7,571,413 B1* | 8/2009 | Ghosh Dastidar .......... G01R 31/31851 326/37 |
| 8,120,410 B2 | 2/2012 | Meijer et al. |
| 8,273,610 B2 | 9/2012 | Or-Bach et al. |
| 2003/0081389 A1 | 5/2003 | Nair et al. |
| 2009/0067105 A1* | 3/2009 | Lin et al. .................... 361/56 |
| 2009/0244873 A1 | 10/2009 | Lu et al. |
| 2010/0328826 A1* | 12/2010 | Salman ................... H01L 21/84 361/56 |
| 2012/0147567 A1* | 6/2012 | Lee ..................... H01L 25/0655 361/729 |
| 2012/0211885 A1 | 8/2012 | Choi et al. |

FOREIGN PATENT DOCUMENTS

TW        201037834        10/2010

* cited by examiner

*Primary Examiner* — Eric Thomas
*Assistant Examiner* — Michael P McFadden (57) ABSTRACT

An integrated circuit package may include a substrate and an interposer. The interposer is disposed over the substrate. The interposer may include embedded switching elements that may be used to receive different power supply signals. An integrated circuit with multiple logic blocks is disposed over the substrate. The switching elements embedded in the interposer may be used to select a power supply signal from the power supply signals and may be used to provide at least one circuit block in the integrated circuit with a selected power supply signal.

21 Claims, 6 Drawing Sheets

FIG. 6 ved. Embodiments of the present invention include
INTEGRATED CIRCUIT PACKAGE WITH ACTIVE INTERPOSER

BACKGROUND

Integrated circuit devices may include circuitry or logic elements that may be used to perform any of a variety of functions. Occasionally, the logic elements may be placed or grouped according to their functionality or operating voltages. An integrated circuit device may thus be partitioned into different logic regions and voltage islands.

As an example, each voltage island may operate at a different voltage level and switches may be used to turn each voltage island on and off. For example, depending on application requirements, certain voltage regions or voltage islands may be turned on while other voltage regions may be turned off. Switches may also be used to tune the performance or power level for a logic region, which may in turn reduce power leakage and optimize performance of the device.

Generally, switches may need to be placed within their respective logic regions. As an example, a switch that controls a specific logic region is generally placed within that region. Accordingly, the area of a particular region may need to be sufficiently sized to accommodate the placement of the switch. Furthermore, depending on the placement of the logic regions and their respective power sources, the switches may need to be sufficiently large to mitigate potential IR drop (also known as voltage drop) problems. As such, additional area on the integrated circuit may need to be reserved for the switches.

SUMMARY

An integrated circuit package with an active interposer is provided. Embodiments of the present invention include interposers with embedded switches that may be used in various packaging configurations.

It is appreciated that the present invention can be implemented in numerous ways, such as a process, an apparatus, a system, or a device. Several embodiments of the present invention are described below.

An integrated circuit (IC) package may include a substrate and an interposer. The interposer may include multiple embedded switching elements and may be mounted on the substrate. The embedded switching elements may be used to receive different power supply signals. An integrated circuit with multiple circuit blocks may be disposed over the interposer and the substrate. Accordingly, the switching elements in the interposer may select and provide a power supply signal to at least one circuit block in the integrated circuit. As an example, the power supply signals may have different voltage levels and the switching elements may be configured to provide a selected voltage level to a particular circuit block.

An integrated circuit device may include an integrated circuit with different logic regions. A logic region may receive one power supply signal while another logic region may receive a different power supply signal. The integrated circuit device may further include an interposer with embedded switching elements. The switching elements may provide different power supply signals to the logic regions in the integrated circuit. For example, the different power supply signals may include different voltage levels. As such, one switching element may provide one voltage level to a particular logic region while another switching element may provide another voltage level to a different logic region.

A method of manufacturing an integrated circuit package may include forming multiple switching elements in an interposer. The method further includes mounting an integrated circuit on the interposer and mounting the interposer, with the integrated circuit, on a package substrate. The integrated circuit may include different logic regions. The switching elements in the interposer may provide each logic region in the integrated circuit with a selected power supply signal through a plurality of interconnects.

Further features of the invention, its nature and various advantages, will be more apparent from the accompanying drawings and the following detailed description of the preferred embodiments.

DETAILED DESCRIPTION

The illustrative embodiments provided herein include integrated circuit (IC) structures with active interposers and techniques for creating such interposers.

It will be obvious, however, to one skilled in the art, that the present exemplary embodiments may be practiced without some or all of these specific details. In other instances, well-known operations have not been described in detail in order not to unnecessarily obscure the present embodiments.

An integrated circuit device may include logic blocks that operate at different voltage levels (e.g., different power supply voltage levels) depending on different user designs that may be loaded onto it. Such logic blocks may be grouped together to form logic regions based on their operating speeds, power consumption, and/or other circuit attributes. These logic regions may sometimes be referred to as voltage islands as they may require different voltage levels, depending on their respective operating states. Accordingly, switches may be used to supply different voltage levels to the various voltage islands. However, as described above, depending on their placement, the switches may experience voltage drops. Additional space may also be required on the IC to accommodate all the switches that may be needed.

One of the embodiments describes an interposer with embedded switches that may be used to control or supply different voltage levels to various logic regions on an IC. The IC may be mounted on the interposer and the logic regions may provide control signals to the switches in the interposer. Depending on the control signals received from the respective logic regions, the switches may be enabled or disabled to provide different power supply signals or voltage levels to the respective logic regions. In one embodiment, the interposer may include an intermediary substrate layer with embedded passive or active devices (e.g., switches, diodes, capacitors, etc.) coupled to the IC. Different package configurations may be employed in this context. As an example, more than one IC may be coupled to the interposer and the switches in the interposer may be used to control power to at least one of the ICs coupled to the interposer.

Figure 1:
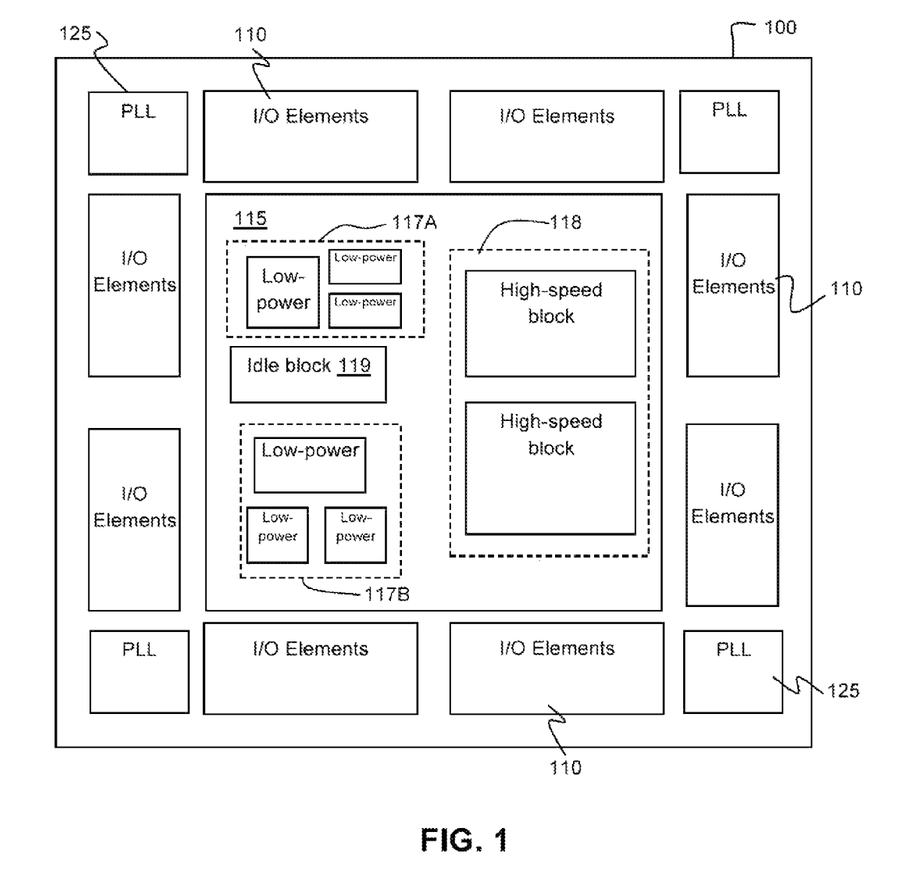
FIG. 1 shows a simplified block diagram of an integrated circuit in accordance with one embodiment of the present invention.

FIG. 1, meant to be illustrative and not limiting, shows a simplified block diagram of IC 100 in accordance with one embodiment of the present invention. IC 100 includes core logic region 115 and input-output elements 110. Other auxiliary circuits, such as phase-locked loops (PLLs) 125 for clock generation and timing, may be located outside core logic region 115 (e.g., at corners of IC 100 and adjacent to input-output elements 110, or at any other desired location on integrated circuit 100).

In the embodiment of FIG. 1, input-output elements 110 may include input-output buffers that connect IC 100 to other external components (not shown in FIG. 1). Accordingly, IC 100 may receive signals from external circuitry at input-output elements 110 and the signals may be routed from input-output elements 110 to core logic region 115 or other logic blocks within IC 100. Core logic region 115 and other logic blocks within IC 100 may perform functions based on the signals received.

Core logic region 115 may be populated with logic cells that may include "logic elements" (LEs), among other circuits. LEs may include look-up table-based logic regions and may be grouped into "Logic Array Blocks" (LABs). The LEs and groups of LEs or LABs may be configured to perform logical functions desired by the user. Configuration data loaded into configuration memory can be used to produce control signals that configure the LEs and groups of LEs and LABs to perform the desired logical functions.

In the embodiment of FIG. 1, the LEs in core logic region 115 may be grouped according to their power consumption and operating speed. As an example, low-power circuit blocks (or circuit blocks that are coupled to relatively lower voltages) may be grouped together to form voltage islands 117A and 117B, high-speed circuit blocks (high-speed circuit blocks may generally need to be powered by higher voltages compared to low-speed circuit blocks) may be similarly grouped to form high-speed island 118, and idle circuit block 119 may form another voltage island on its own. It should be appreciated that even though only a few logic regions (e.g., voltage islands or logic regions 117A, 117B, 118 and idle circuit block 119) are shown, fewer or more circuit blocks may be grouped together to form different logic regions or voltage islands in this context.

Figure 2:
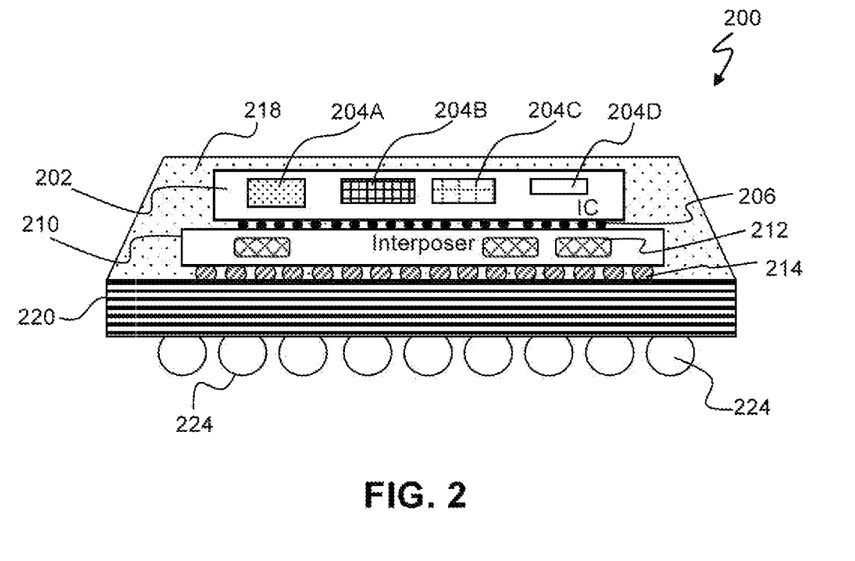
FIG. 2 is a side view of an illustrative integrated circuit package with an integrated circuit die and an interposer in accordance with an embodiment of the present invention.

FIG. 2 is a cross-sectional side view of an illustrative IC package 200 with IC die 202 and interposer 210 placed in between IC die 202 and substrate 220 in accordance with an embodiment of the present invention. IC die 202, together with interposer 210, may be disposed over substrate 220 and IC package 200 may be encapsulated by molding compound 218. In one embodiment, substrate 220 may be a package substrate that couples IC die 202 and interposer 210 to external circuitry through solder balls 224.

In the embodiment of FIG. 2, IC die 202 may be a flip chip die with a plurality of microbumps 206 on one side of the die for signal transmission between IC die 202 and interposer 206. IC die 202 may be similar to IC 100 of FIG. 1 and may include various voltage islands or logic regions 204A-204D that may be provided with different power supply signals using interposer 210 (the details of which will be explained in subsequent paragraphs with reference to FIGS. 5A and 5B). Interposer 210 is mounted on substrate 220 and signals may be transmitted between interposer 210 and substrate 220 through package bumps 214 on one surface of interposer 210.

Interposer 210 may be a smart interposer (e.g., an interposer with embedded active elements such as switches and diodes) with embedded switching elements 212. In one embodiment, switching elements 212 embedded in interposer 210 may be used to provide different power supply signals (e.g., different voltage levels) to each of the logic regions or voltage islands 204A-204D in IC die 202. For example, voltage island 204A may be a low-power logic region and voltage island 204B may be an idle logic region. As such, switching elements 212 in interposer 210 may be used to supply different power supply signals or voltage levels to voltage islands 204A and 204B (and also 204C and 204D).

Figure 3A:
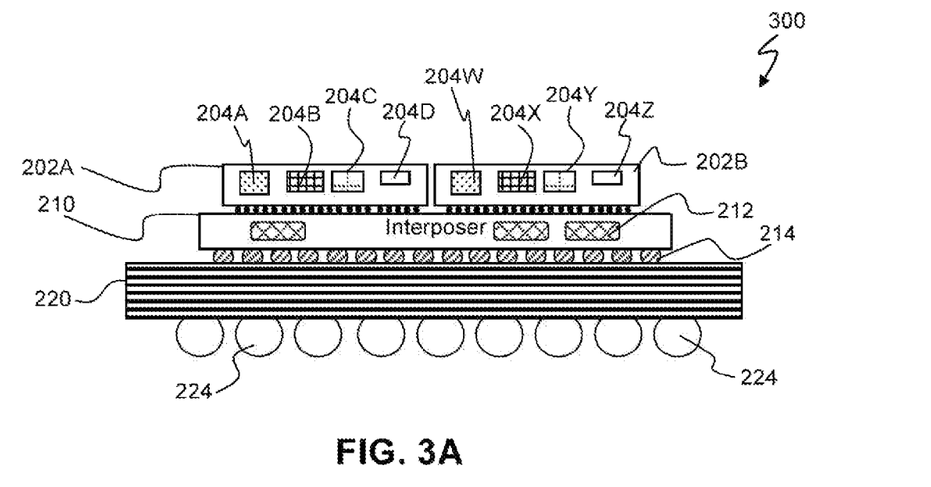
FIG. 3A is a side view of an illustrative integrated circuit package with two integrated circuit dies disposed over an interposer in accordance with one embodiment of the present invention.

FIG. 3A is a cross-sectional side view of an illustrative IC package 300 with two IC dies 202A and 202B disposed over interposer 210 in accordance with one embodiment of the present invention. Integrated circuit packages including multiple integrated circuit dies mounted on an interposer may sometimes be referred to as 2.5D packages. It should be appreciated that IC package 300 shares similarities with IC package 200 of FIG. 2 and as such, for the sake of brevity, elements that have been described above (e.g., substrate 220, solder balls 224, package bumps 214, etc.) will not be described in detail again.

The IC package configuration shown in FIG. 3A may be commonly known as a 2.5D package configuration. As shown in the embodiment of FIG. 3A, IC package 300 includes IC dies 202A and 202B placed adjacent to each other. It should be appreciated that IC dies 202A and 202B may be identical IC dies or may be different dies. In one embodiment, each of IC dies 202A and 202B may have multiple logic regions operating at different voltage levels (204A-204B and 204W-204Z, respectively). Accordingly, switching elements 212 in interposer 210 may be used to supply different voltage levels to the respective voltage regions (204A-204B and 204W-204Z, respectively) in IC dies 202A and 202B.

Figure 3B:
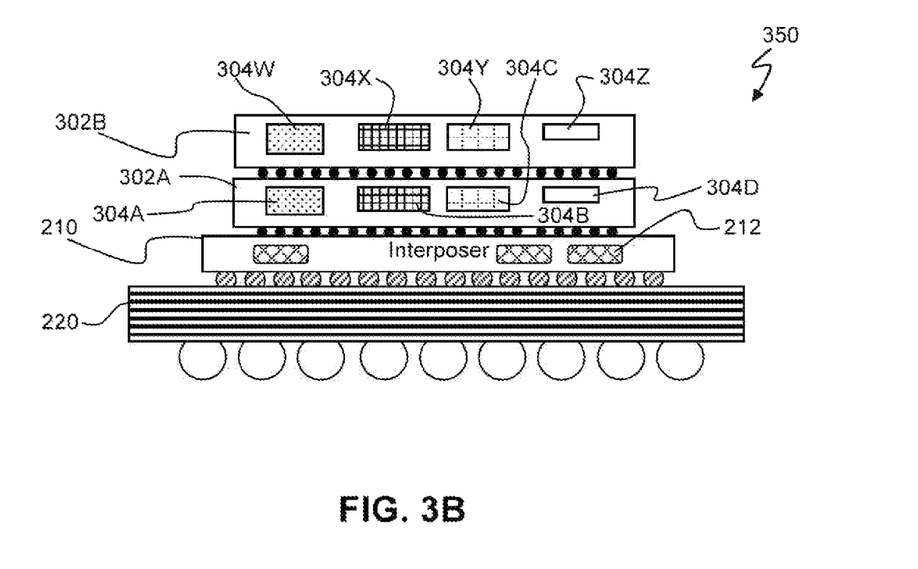
FIG. 3B shows a side view of an illustrative integrated circuit package with two integrated circuit dies, stacked on top of each other and an interposer, in accordance with one embodiment of the present invention.

FIG. 3B shows a side view of illustrative IC package 350 with IC dies 302A and 302B stacked over interposer 210 in accordance with one embodiment of the present invention. It should be appreciated that a stacked configuration, such as IC package 350, may be commonly known as a 3-dimensional (3D) IC package (e.g., an IC package with IC dies stacked vertically on top of each other). It should be appreciated that IC die 302A may include through-silicon vias (not shown in FIG. 3B) extending from one surface of IC die 302A to another for signal transmission between IC dies 302A and 302B. In the embodiment of FIG. 3B, interposer 210 (with embedded switching elements 212) is placed between IC die 302A and substrate 220. Another die (e.g., IC die 302B) may be stacked on top of IC die 302A.

In one embodiment, switching elements 212 embedded in interposer 210 may be used to control voltage islands within IC die 302A (e.g., voltage islands 304A-304D) or voltage islands within IC die 302B (e.g., voltage islands 304W-304Z). It should be appreciated that even though only two IC dies, 302A and 302B, are shown in the embodiment of FIG. 3B, additional IC dies may be similarly stacked in a 3D IC package. Additional interposers with embedded elements, similar to interposer 210, may also be used in this context. For example, an additional interposer may be disposed over IC die 302A and beneath IC die 302B (e.g., sandwiched between IC die 302A and 302B).

Figure 4A:
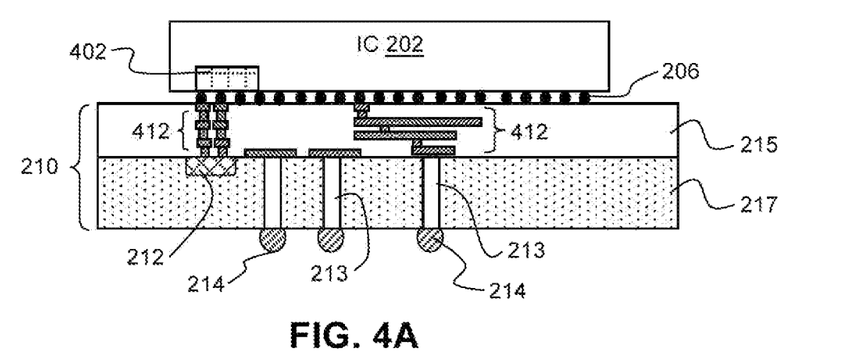
FIG. 4A shows a more detailed representation of an interposer with a switching element in accordance with one embodiment of the present invention.

FIG. 4A shows a more detailed representation of an interposer (e.g., interposer 210) with one switching element (e.g., switching element 212) in accordance with one embodiment of the present invention. In the embodiment of FIG. 4A, interposer 210 includes redistribution (conducting) layer 215 and substrate layer 217 (e.g., p-type substrate). IC die 202 with microbumps 206 is disposed over interposer 210. Control circuit 402 is shown in IC die 202. Control circuit 402 may be a control circuit in one of the voltage regions (similar to voltage regions 204A-204D in the embodiment of FIG. 2, not shown in FIG. 4A) that is used to provide appropriate control signals from IC die 202 to switching element 212 in interposer 210. It should be appreciated that even though only one switching element 212 is shown in the embodiment of FIG. 4A, multiple switching elements 212 may be included in interposer 210 to provide different voltage levels to different voltage islands or logic regions in IC die 202. Accordingly, one or more control circuits such as control circuit 402 may be used to control the different switching elements in IC die 202.

Conducting layer 215 may include one or more metal interconnect layers. Interconnects 412 may be formed in the metal interconnect layers (e.g., paths formed in one or more metal interconnect layers with vias connecting one metal layer to another). Control signals from control circuit 402 in IC die 202 are transmitted through interconnects 412 in conducting layer 215 to switching element 212. In one embodiment, switching element 212 may be a P-type metal-oxide-semiconductor field-effect (PMOS) transistor placed directly below its corresponding voltage island or control circuit 402 in IC die 202. In another embodiment, switching element 212 may be formed by an N-type metal-oxide-semiconductor field-effect (NMOS) transistor. However, to drive the gate of an NMOS transistor high, a relatively higher voltage may be needed (compared to the voltage needed to drive the gate of a PMOS transistor high). It should be appreciated that switching element 212 may be sufficiently large to minimize potential IR drop effects due to channel resistance of switch transistors. Substrate layer 217 may include multiple through-silicon vias (TSVs) 213 that provide vertical electrical connections from redistribution or conducting layer 215 to package bumps 214 at a bottom surface of interposer 210.

Figure 4B:
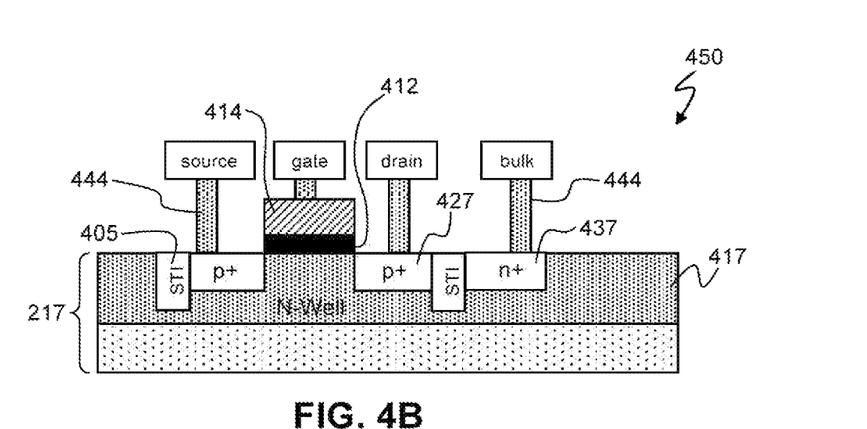
FIG. 4B shows an illustrative P-type metal-oxide-semiconductor field-effect (PMOS) transistor embedded in an interposer in accordance with one embodiment of the present invention.

FIG. 4B shows an illustrative PMOS transistor 450 embedded in an interposer in accordance with one embodiment of the present invention. It should be appreciated that FIG. 4B shows substrate layer 217 of an interposer (e.g., interposer 210 of FIG. 4A). In the embodiment of FIG. 4B, N-well region 417 may be formed in substrate layer 217 of the interposer. Shallow trench isolation (STI) regions 405 may be formed after the formation of N-well region 417.

Gate oxide (e.g., silicon oxide) 412 and poly-silicon 414 may be etched over the N-well region 417 after STI regions 405 have been formed. It should be appreciated that gate oxide 412 and poly-silicon 414 may form a gate stack in PMOS transistor 450. N-well region 417 may be doped with p-type dopant 427 and n-type dopant 437 after the etching of the gate stack. Contacts 444 are formed over N-well region 417 for the source, gate, drain and bulk terminals. In one embodiment, PMOS transistor 450 may be used as a switching element (e.g., switching element 212 of FIG. 4A). It should be appreciated that even though a PMOS transistor 450 is shown in the embodiment of FIG. 4B, other types of circuits or devices (e.g., NMOS transistors, Micro-Electro-Mechanical switches, decoupling capacitors, diodes, etc.) may be formed in the interposer. For instance, to form a decoupling capacitor, the source, drain and bulk terminals of transistor 450 may be connected together as a single terminal.

Figure 4C:
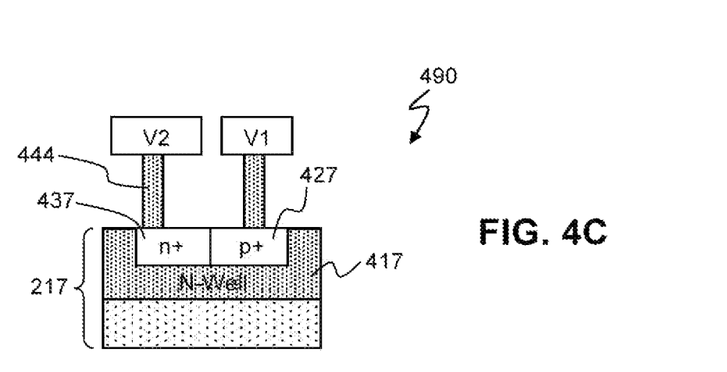
FIG. 4C shows an illustrative diode embedded in an interposer in accordance with one embodiment of the present invention.

Various types of devices or circuits may be embedded in an interposer (e.g., interposer 210 of FIGS. 2, 3A, 3B and 4A). FIG. 4C shows an illustrative diode 490 embedded in an interposer in accordance with one embodiment of the present invention. In the embodiment of FIG. 4C, N-well region 417 may be formed in substrate layer 217 of the interposer. N-well region 417 may be doped with p-type dopant 427 and n-type dopant 437. Contacts 444 are formed over N-well region 417 for the two terminals, V1 and V2, of diode 490.

Figure 5A:
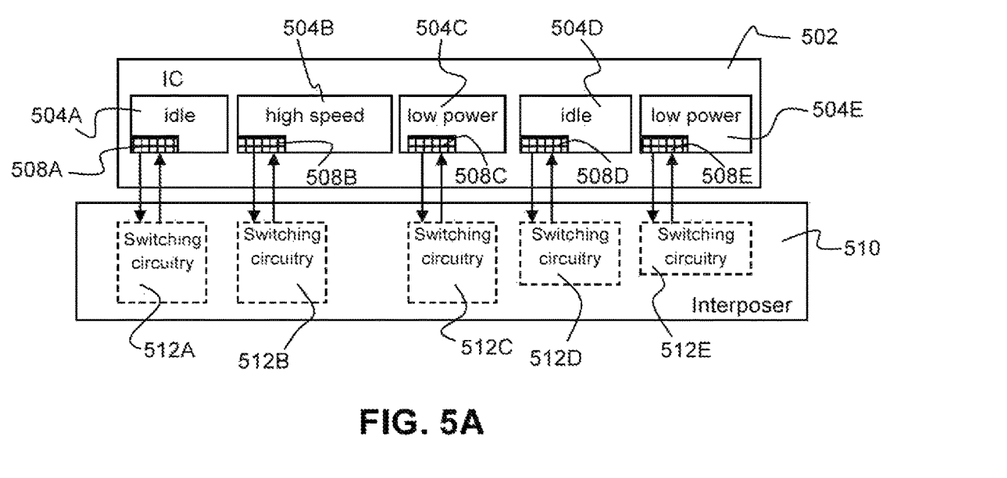
FIG. 5A shows an illustrative integrated circuit disposed over an interposer with embedded switching circuitries in accordance with one embodiment of the present invention.

FIG. 5A shows an illustrative IC 502 disposed over interposer 510 with embedded switching circuitries 512A-512E in accordance with one embodiment of the present invention. In one embodiment, IC 502 may include circuit blocks that are grouped according to their power consumption. For example, idle circuit blocks may be grouped together to form idle regions (e.g., idle regions 504A and 504D), high speed circuit blocks may be grouped together to form a high speed logic region (e.g., high speed region 504B), and low power blocks may similarly be grouped together to form low power logic regions (e.g., 504C and 504E). In another embodiment, circuit blocks may be grouped according to their functions. For example, a voltage island may be formed by a group of digital signal processing (DSP) blocks, another voltage island may be formed by a group of input-output blocks, and yet another voltage island may be formed by a group of memory modules.

In the embodiment of FIG. 5A, each of logic regions 504A-504E may include a control circuit (e.g., control circuits 508A-508E, respectively). Control circuits 508A-508E may receive configuration signals from various sources (e.g., configuration random access memory, used input, other control circuitry, predetermined voltage level etc.). Accordingly, the configuration signals may be transmitted as control signals to the respective switching circuitries 512A-512E (e.g., to activate or enable the respective transistors in the switching circuitry). Switching circuitries 512A-512E may accordingly provide appropriate power supply signals (e.g., voltage levels) to the respective logic regions 504A-504E based on control signals from the respective control circuits 508A-508E.

Figure 5B:
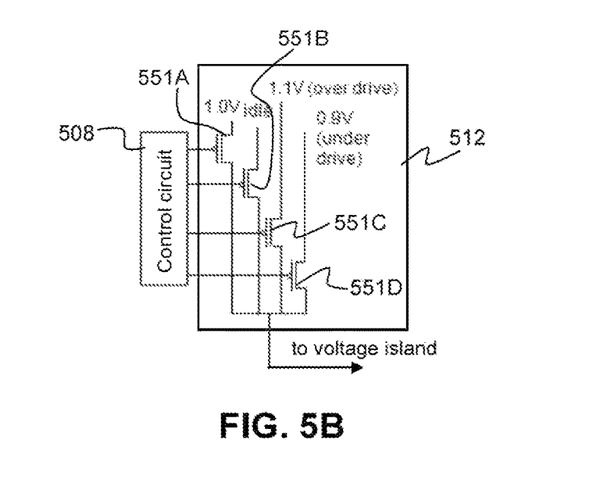
FIG. 5B shows an illustrative example of switching circuitry with multiple transistors in accordance with one embodiment of the present invention.

FIG. 5B shows an illustrative example of switching circuitry 512 with multiple transistors in accordance with one embodiment of the present invention. In the embodiment of FIG. 5B, switching circuitry 512 includes four PMOS transistors 551A-551D, each with a gate terminal coupled to control circuit 508. A source-drain terminal of each of the PMOS transistors 551A-551D may be coupled to receive a power supply signal (e.g., a different voltage level).

In the example of FIG. 5B, a source-drain terminal of PMOS transistor 551A is coupled to receive 1 volt while a source-drain terminal of PMOS transistor 551B may be coupled to receive a minimal voltage level. Accordingly, a source-drain terminal of PMOS transistor 551C may be coupled to receive an over-drive voltage (e.g., 1.1V) and a source-drain terminal of PMOS transistor 551D may be coupled to receive an under-drive voltage (e.g., 0.9V). Another source-drain terminal of each of the PMOS transistors 551A-551D is coupled to its corresponding voltage island or logic region on the IC (e.g., IC 502 of FIG. 5A). It should be appreciated that switching circuitry 512 may represent any of the switching circuitries, 512A-512E, in FIG. 5A and control circuit 508 may represent any of the control circuits 508A-508E in IC 502.

As an example, in response to control signals received from control circuit 508A of FIG. 5A, PMOS transistor 551B in switching circuitry 512B may be turned on while PMOS transistors 551A, 551C, and 551D may be turned off (e.g., only one pass transistor may enabled at any given time). As another example, in response to control signals received from control circuit 508C of FIG. 5A, PMOS transistor 551C in switching circuitry 512C may be turned on while PMOS transistors 551A, 551B, and 551D may be turned off so that an appropriate power supply signal (e.g., under-drive voltage level, 0.9V) may be supplied to logic region or voltage island 504C of FIG. 5A. It should be appreciated that each of the PMOS transistors 551A-551D in switching circuitry 512 may receive different power supply signals or voltage levels from various power sources (e.g., regulator circuits, output from other logic blocks, external circuitry, etc.).

Figure 6:
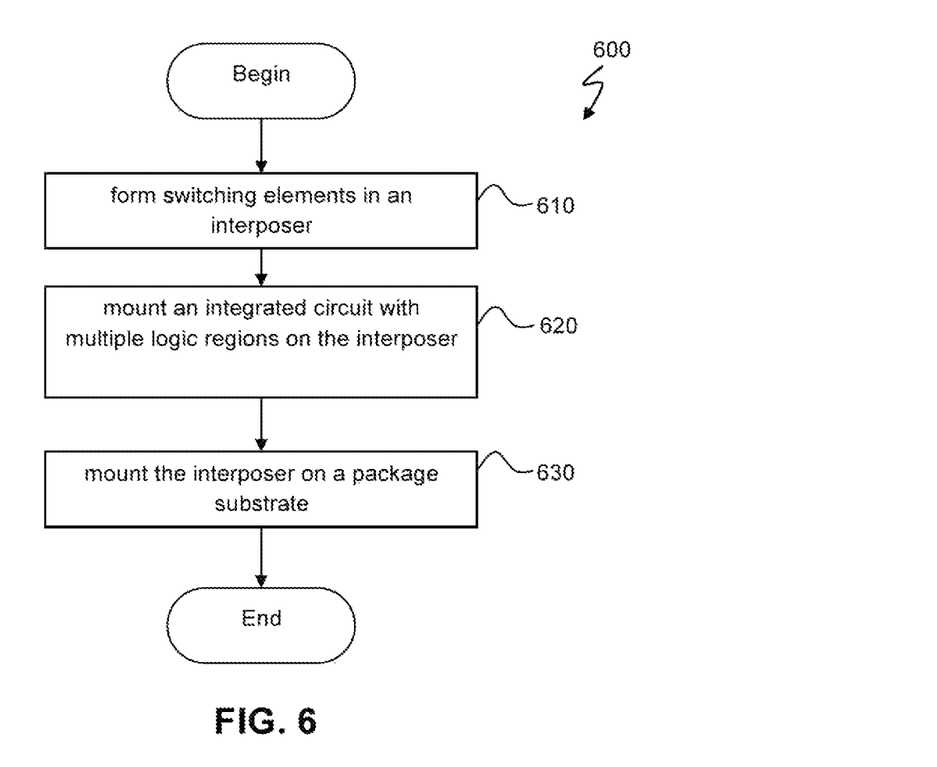
FIG. 6 shows simplified method for packaging an IC in accordance with one embodiment of the present invention.

FIG. 6 shows simplified method 600 for packaging an IC in accordance with one embodiment of the present invention. At step 610, switching elements are formed in an interposer. The interposer thus formed may be similar to interposer 210 of the embodiments of FIGS. 2, 3A, 3B and 4A. The switching elements that are embedded in the interposer may be formed by transistors or diodes (e.g., transistor 450 of FIG. 4B and diode 490 of FIG. 4C). An IC is mounted on the interposer at step 620, and at step 630, the interposer (together with the IC) is mounted on a package substrate. In one embodiment, the IC may include multiple circuit blocks that are grouped together to form different logic regions or voltage islands (e.g, IC 100 of FIG. 1). It should be appreciated that steps in method 600 are shown in a specific order in the embodiment of FIG. 6, the described steps may be adjusted so that they occur at different times. For instance, depending on different manufacturing or process requirements, the interposer may be mounted on the substrate (without the IC). The IC may then be subsequently mounted on the interposer after the interposer has been mounted on the substrate.

Even though only one IC is mentioned in method 600, additional IC dies and interposers (with or without embedded devices) may be included in an IC package. For instance, an additional IC die may be placed adjacent to the IC die that has been mounted on the interposer at step 630 (e.g., IC dies 202A and 202B of FIG. 3A). The additional IC die may further include multiple logic regions or voltage islands and the embedded switching elements may provide appropriate power supply signals to the different logic regions in both the IC dies. Additional IC dies may also be stacked on top of each other, similar to the configuration of IC package 350 of FIG. 3B, and the embedded switching elements may provide different power supply signals (as required) to the stacked IC dies.

It should be appreciated that even though specific configurations are shown in the embodiments of FIGS. 2, 3A, 3B and 4A, different configurations may be employed in this context. It should be appreciated that a flip chip package with a ball grid array is provided in the exemplary illustrations of FIGS. 2, 3A, 3B and 4A. However, the use of flip chip ball grid array IC packages is not meant to be limiting as the techniques described herein may be applied to other packaging configurations (e.g., heat spreader ball grid arrays (HSBGAs), low profile ball grid arrays (LBGAs), thin fine pitch ball grid array (TFBGAs), flip chip chip-scale packages (FCCSPs), etc.).

The method and apparatus described herein may be incorporated into any suitable circuit. For example, the method and apparatus may be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit package comprising:
   a substrate;
   an interposer having a plurality of embedded switching elements disposed over the substrate, wherein the plurality of embedded switching elements receives a plurality of power supply signals; and
   an integrated circuit having a plurality of circuit blocks disposed over the substrate, wherein the plurality of embedded switching elements provides at least one circuit block of the plurality of circuit blocks with a selected power supply signal of the plurality of power supply signals.

2. The integrated circuit package defined in claim 1, wherein each circuit block of the plurality of circuit blocks includes a control circuit that controls at least one embedded switching element from the plurality of embedded switching elements.

3. The integrated circuit package defined in claim 2, wherein the plurality of embedded switching elements comprises a plurality of transistors each having a source-drain terminal that receives a power supply signal of the plurality of power supply signals, and wherein each control circuit controls a respective set of embedded switching elements of the plurality of embedded switching elements.

4. The integrated circuit package defined in claim 3, wherein the control circuit provides a control signal to a gate of at least one transistor of the plurality of transistors and wherein the control circuit activates the transistor using the control signal.

5. The integrated circuit package defined in claim 3 wherein the plurality of transistors comprises a plurality of P-type metal-oxide-field-effect-transistors.

6. The integrated circuit package defined in claim 1, wherein the interposer comprises a substrate layer and a plurality of redistribution layers, wherein the plurality of redistribution layers comprises a plurality of interconnects that is coupled to the integrated circuit, wherein the plurality of embedded switching elements is formed in the substrate layer, and wherein the plurality of embedded switching elements is coupled to the integrated circuit through the plurality of interconnects.

7. The integrated circuit package defined in claim 1 further comprising:
an additional integrated circuit disposed over the interposer, wherein the plurality of switching elements in the interposer transmits a plurality of power supply signals to the integrated circuit and the additional integrated circuit.

8. An integrated circuit device comprising:
an integrated circuit having a plurality of logic regions, wherein a first portion of the plurality of logic regions receives a first power supply signal and wherein a second portion of the plurality of logic regions receives a second power supply signal; and
an interposer having a plurality of switching elements coupled to the integrated circuit, wherein, in a first configuration, a first switching element provides the first portion of the plurality of logic regions with the first power supply signal, and wherein a second switching element provides the second portion of the plurality of logic regions with the second power supply signal.

9. The integrated circuit device defined in claim 8, wherein the first and second power supply signals comprise first and second voltage levels, respectively, wherein, in a second configuration, the first switching element provides the second portion of the plurality of logic regions with the first power supply signal and the second switching element provides the first portion of the plurality of logic regions with the second power supply signal.

10. The integrated circuit device defined in claim 8, wherein each switching element of the plurality of switching elements is selected from the group consisting of: a P-type metal-oxide-field-effect-transistor, an N-type metal-oxide-field-effect-transistor, and a Micro-Electro-Mechanical switches.

11. The integrated circuit device defined in claim 8 further comprising:
first control circuitry in the first portion of the plurality of logic regions; and
second control circuitry in the second portion of the plurality of logic regions, wherein the first and second control circuitries selectively enable the first and second switching elements, respectively.

12. The integrated circuit device defined in claim 11, wherein the first and second control circuitries receive a control signal selected from the group consisting of: a configuration random access memory bit, a user input, an output signal from external circuitry, and a predetermined voltage level.

13. The integrated circuit device defined in claim 8 further comprising:
an additional integrated circuit coupled to the interposer layer, wherein the additional integrated circuit comprises an additional plurality of logic regions, wherein the plurality of switching elements provides the additional plurality of logic regions with a plurality of power supply signals.

14. The integrated circuit device defined in claim 8, wherein the interposer comprises a substrate layer and a plurality of redistribution layers, wherein the plurality of redistribution layers includes a plurality of interconnects that is coupled to the integrated circuit, and wherein the plurality of switching elements is formed in the substrate layer.

15. The integrated circuit device defined in claim 14, wherein the substrate layer includes a plurality of through-silicon vias and wherein the plurality of switching elements is coupled to the integrated circuit through the plurality of interconnects in the plurality of redistribution layers.

16. A method of packaging an integrated circuit, the method comprising:
forming a plurality of switching elements in an interposer;
mounting the interposer on a package substrate; and
mounting an integrated circuit having a plurality of logic regions on the interposer, wherein each switching element of the plurality of switching elements provides the plurality of logic regions with a selected power supply signal through a plurality of interconnects.

17. The method defined in claim 16, wherein the interposer includes a substrate layer and a plurality of redistribution layers, and wherein forming the plurality of switching elements comprises:
depositing a silicon oxide layer over a dielectric layer on the substrate layer;
depositing a polysilicon layer over the silicon oxide layer;
removing a portion of the polysilicon layer and the silicon oxide layer to form at least one gate stack;
implanting a source region and a drain region in the substrate layer; and
forming a plurality of contacts over the source and drain regions and the at least one gate stack.

18. The method defined in claim 17 further comprising:
implanting an n-well region in the substrate, wherein implanting the source and drain regions in the substrate layer comprises implanting the source and drain regions in the n-well region.

19. The method defined in claim 16 further comprising:
mounting an additional integrated circuit having an additional plurality of logic regions on the interposer wherein each switching element of the plurality of switching elements provides the additional plurality of logic regions with an additional selected power supply signal through the plurality of interconnects.

20. The method defined in claim 16 further comprising:
forming a diode in the interposer prior to the disposing of the interposer over the package substrate.

21. The method defined in claim 16 further comprising:
forming a de-coupling capacitor in the interposer prior to the disposing of the interposer over the package substrate.

* * * * *